US009018760B2

(12) United States Patent
Arvin et al.

(10) Patent No.: US 9,018,760 B2
(45) Date of Patent: Apr. 28, 2015

(54) SOLDER INTERCONNECT WITH NON-WETTABLE SIDEWALL PILLARS AND METHODS OF MANUFACTURE (71) Applicant: International Business Machines Corporation, Armonk, NY (US)

(72) Inventors: Charles L. Arvin, Savannah, GA (US); Raschid J. Bezama, Mahopac, NY (US); Timothy H. Daubenspeck, Essex Junction, VT (US); Jeffrey P. Gambino, Essex Junction, VT (US); Christopher D. Muzzy, Essex Junction, VT (US); David L. Questad, Hopewell Junction, NY (US); Wolfgang Sauter, Avon, CO (US); Timothy D. Sullivan, Essex Junctin, VT (US); Brian R. Sundlof, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/083,610

(22) Filed: Nov. 19, 2013

(65) Prior Publication Data
US 2014/0077367 A1 Mar. 20, 2014

Related U.S. Application Data (62) Division of application No. 12/700,863, filed on Feb. 5, 2010, now Pat. No. 8,637,392.

(51) Int. Cl.
*H01L 29/41* (2006.01)
*H01L 23/00* (2006.01)
*H01L 23/498* (2006.01)

(52) U.S. Cl.
CPC .......... *H01L 24/13* (2013.01); *H01L 23/49811* (2013.01); *H01L 24/11* (2013.01); *H01L 24/16* (2013.01); *H01L 2224/05647* (2013.01); *H01L 2224/05655* (2013.01); *H01L 2224/05666* (2013.01); *H01L 2224/11334* (2013.01); *H01L 2224/1146* (2013.01); *H01L 2224/1147* (2013.01); *H01L 2224/1182* (2013.01);
(Continued)

(58) Field of Classification Search
USPC .................. 257/737, 766, 773, 779, 780, 781, 257/E23.068, E23.017, E23.026, E23.027, 257/E23.028, E21.589; 438/614, 652, 675, 438/677
See application file for complete search history.

(56) References Cited

U.S. PATENT DOCUMENTS 3,765,954 A    10/1973    Tokuda et al.
4,884,123 A    11/1989    Dixit et al.
(Continued)

FOREIGN PATENT DOCUMENTS

JP    2000-323510    * 11/2000    ............. H01L 21/60

OTHER PUBLICATIONS

Machine translation, Azuma, JP 2000-323510, (translation date: Feb. 24, 2014), JPO & Japio, all pages.*

*Primary Examiner* — Fernando L Toledo
*Assistant Examiner* — Victoria K Hall
(74) *Attorney, Agent, or Firm* — David Cain; Roberts Mlotkoswki Safran & Cole, P.C.

(57) ABSTRACT

A solder interconnect structure is provided with non-wettable sidewalls and methods of manufacturing the same. The method includes forming a nickel or nickel alloy pillar on an underlying surface. The method further includes modifying the sidewall of the nickel or nickel alloy pillar to prevent solder wetting on the sidewall.

13 Claims, 5 Drawing Sheets

(52) U.S. Cl.
CPC . *H01L2224/119* (2013.01); *H01L 2224/13017* (2013.01); *H01L 2224/13018* (2013.01); *H01L 2224/13083* (2013.01); *H01L 2224/13084* (2013.01); *H01L 2224/13101* (2013.01); *H01L 2224/13144* (2013.01); *H01L 2224/13147* (2013.01); *H01L 2224/13155* (2013.01); *H01L 2224/13565* (2013.01); *H01L 2224/1357* (2013.01); *H01L 2224/13687* (2013.01); *H01L 2924/01029* (2013.01); *H01L 2924/01079* (2013.01); *H01L 2924/01082* (2013.01); *H01L 2924/3841* (2013.01); *H01L 2924/01005* (2013.01); *H01L 2924/01006* (2013.01); *H01L 2924/01019* (2013.01); *H01L 2924/01033* (2013.01); *H01L 2924/01074* (2013.01); *H01L 2924/014* (2013.01); *H01L 2924/01327* (2013.01); *H01L 2224/10126* (2013.01)

(56) References Cited

U.S. PATENT DOCUMENTS

| | | | |
|---|---|---|---|
| 5,011,580 A | 4/1991 | Pan et al. | |
| 5,071,518 A | 12/1991 | Pan et al. | |
| 6,136,419 A * | 10/2000 | Fasano et al. | 428/210 |
| 6,378,758 B1 | 4/2002 | Haba | |
| 6,448,171 B1 | 9/2002 | Wang et al. | |
| 6,592,019 B2 | 7/2003 | Tung | |
| 6,653,170 B1 | 11/2003 | Lin | |
| 7,087,458 B2 | 8/2006 | Wang | |
| 7,126,195 B1 | 10/2006 | Sandhu et al. | |
| 7,446,419 B1 | 11/2008 | Lin et al. | |
| 7,491,636 B2 | 2/2009 | Farnworth | |
| 8,664,760 B2 * | 3/2014 | Yu et al. | 257/737 |
| 2004/0130034 A1 | 7/2004 | Alvarez | |
| 2006/0087034 A1 | 4/2006 | Huang et al. | |
| 2006/0088992 A1 | 4/2006 | Huang et al. | |
| 2006/0094226 A1 | 5/2006 | Huang et al. | |
| 2007/0020912 A1 * | 1/2007 | Nishiyama et al. | 438/613 |
| 2007/0023923 A1 | 2/2007 | Salmon | |
| 2007/0052109 A1 | 3/2007 | Chen et al. | |
| 2007/0108606 A1 | 5/2007 | Watanabe | |
| 2007/0111499 A1 | 5/2007 | Lo | |
| 2007/0184579 A1 | 8/2007 | Huang et al. | |
| 2007/0264519 A1 | 11/2007 | Kinzer | |
| 2008/0048320 A1 | 2/2008 | Lee et al. | |
| 2009/0001568 A1 | 1/2009 | Mancera et al. | |
| 2009/0149016 A1 * | 6/2009 | Park et al. | 438/614 |
| 2010/0132998 A1 | 6/2010 | Lee et al. | |
| 2012/0306073 A1 * | 12/2012 | Yu et al. | 257/737 |
| 2014/0131864 A1 * | 5/2014 | Yu et al. | 257/737 |

* cited by examiner

Solder Wettable On Sidewall

Pillar Wettable Sidewall

FIG. 1a

Shorting between pillars

SOLDER INTERCONNECT WITH NON-WETTABLE SIDEWALL PILLARS AND METHODS OF MANUFACTURE

FIELD OF THE INVENTION

The invention relates to semiconductor structures and methods of manufacture and, more particularly, to solder interconnect structures with non-wettable sidewalls and methods of manufacturing the same.

BACKGROUND OF THE INVENTION

Copper pillar is a chip-to-package interconnect technology that is entering the market. The advantages in copper lie in the extendability to finer pitch and the superior electromigration (EM) performance compared to conventional solder C4's. The copper pillar provides the enhanced EM performance but increases the die stress for chip-to-chip and chip-to-wafer joints (i.e., 3D applications). The finer pitch is due to its vertical sidewalls.

In copper pillar technology, a small amount of solder is still required to connect the copper pillars on the chips to the pad on the substrate. However, copper pillar-based solder connectors are relatively expensive to fabricate and also difficult to prevent the solder from wetting to the copper pillar sidewall. Such wetting to the sidewall will reduce the standoff, therefore limiting underfill flow and can sometimes lead to solder bridging. Thus, it is desirable to have a pillar structure based solder ball connector that is less expensive to manufacture and avoids side wall wetting.

Figure 1A:
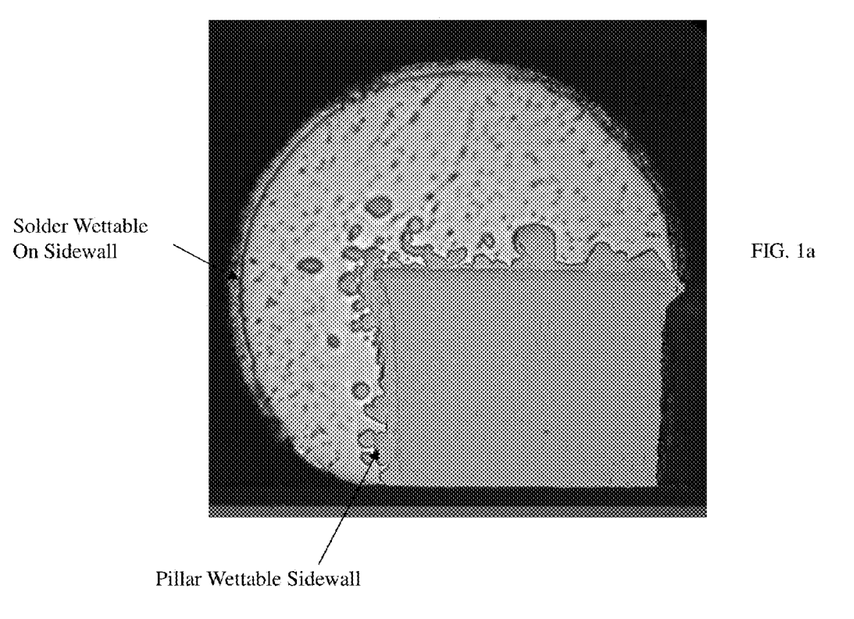
FIGS. 1a and 1b show conventional copper pillar structures with a wettable sidewall.
Figure 1B:
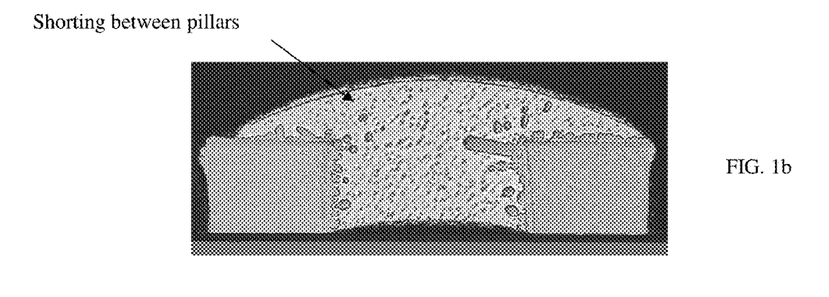

More specifically, FIGS. 1a and 1b show a conventional copper pillar structure with wettable sidewalls. As shown in these views, the solder will flow onto the sidewalls of the copper pillars. This can cause bridging between adjacent copper pillars which, in turn, results in shorting (see, FIG. 1b). Also, although the copper pillars can be used in finer pitch applications, the solder wetting requires the copper pillars to be placed farther apart than desired. For this reason, it is not possible to provide a denser structure of connections.

Accordingly, there exists a need in the art to overcome the deficiencies and limitations described hereinabove.

SUMMARY

In a first aspect of the invention, a method comprises forming a nickel or nickel alloy pillar on an underlying surface. The method further comprises modifying the sidewall of the nickel or nickel alloy pillar to prevent solder wetting on the sidewall.

In another aspect of the invention, a method comprising: forming a liner on a substrate; forming a conductive layer on the liner; depositing a photoresist material on the conductive layer and processing the photoresist material to form an opening therein; forming a non-wettable pillar in the opening; forming a capping layer of wettable material on the pillar; removing the photoresist material; subjecting the pillar to an environment of either nitrogen or oxygen in a furnace to form at least one nitride or oxide sidewall on the pillar; and removing excess nitride or oxide that forms on the capping layer.

In yet another aspect of the invention, a structure comprises at least one pillar structure having a non-wettable surface and at least one modified sidewall composed of oxide or nitride. The structure further comprises a cap on a top surface of the at least one pillar structure that is a wettable surface.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to solder interconnect structures with non-wettable sidewall(s) and methods of manufacturing the same. More specifically, the present invention utilizes a nickel or nickel alloy pillar (compared to a copper pillar) to enable post processes that prevent solder wetting. In this way, the present invention improves device performance with a significant reduction in device shorting between connections, as well as allows denser pitch of interconnects to be formed on the device surface.

In embodiments, the present invention utilizes a nickel or nickel alloy pillar with a modified surface such as, for example, an oxide or nitride sidewall to further enhance the advantages of the present invention. For example, the oxide or nitride sidewall will prevent wetting of the solder. Nickel oxides produce a uniform protective coating that protects the sidewalls of the pillar and alters the surface properties for intermetallic formation with tin solders, for example. Also, although nickel or nickel alloy is more resistive than copper, this has the advantage of causing electrical current to spread laterally more than it would in a pure copper pillar and reducing the current crowding that causes electromigration (EM) damage in solder provided that a highly conductive layer is directly below the nickel or nickel alloy.

In further embodiments, the nickel or nickel alloy pillar can have a gold (Au) or copper (Cu) cap to enhance solder wetting on a top portion of the pillar. However, depending on the soldering processes used, e.g., copper plating techniques, the use of the gold (Au) cap can be eliminated. In further embodiments, the nickel or nickel alloy pillar can be fabricated on a copper layer (platform or pedestal), to bring the overall stresses of the pillar closer to that of copper alone. In embodiments, solder can be C4NP transferred or plated on the pillar.

Presently, the industry is focused on copper (Cu) as being the metal of choice for interconnects because it has superior resistivity properties of the standard metals used, and because of a misperception that some of the metals such as nickel (Ni) would add too much stress to the overall structure. However, by switching from copper (Cu) to nickel (Ni), it is possible to still obtain the same required electromigration (EM) performance but with a metal that has material properties that can be manipulated to stop sidewall wetting.

Figure 2A:
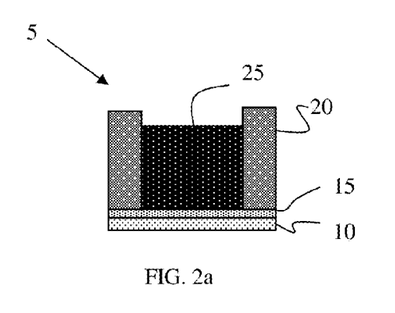
FIGS. 2a-2f show processes and respective structures in accordance with aspects of the invention.

FIGS. 2a-2f show processes and respective structures in accordance with aspects of the invention. In particular, FIG. 2a shows a beginning structure 5. The structure 5 includes forming a liner 10 such as, for example, Ti, Ti Tungsten, or Ti Tungsten Chrome, amongst other layers, on a dielectric layer. In embodiments, the liner 10 can be, for example, about 0.165 microns thick, but can range from about 0.125 to 0.205 microns in thickness, amongst other desirable dimensions. In embodiments, the liner 10 can act as an adhesion layer to an underlying dielectric layer (or substrate), as well as a barrier layer to prevent solder from penetrating the underlying structures.

Still referring to FIG. 2a, a conductive layer 15 is deposited on the liner 10 using conventional processes. For example, the conductive layer 15 can be deposited using a sputtering technique, amongst other known metal deposition techniques. In embodiments, the conductive layer 15 may be, for example, copper or other conductive materials such as, for example, nickel, nickel alloys, copper alloys, etc. The conductive layer 15 may include a seed layer which may be, for example, Ti, Ti Tungsten, or Ti Tungsten Chrome. The conductive layer 15 may be about 0.45 microns thick; although other dimensions are also contemplated by the present invention such as, for example, a range of about between 0.1 to 0.6 microns.

A photoresist material 20 is deposited on the layer 15 using conventional deposition techniques such as, for example, dry film lamination or spin on liquid resist. The photoresist material 20 is then subjected to conventional lithographic and etching processes to form an opening. Thereafter, a pillar 25 of nickel or nickel alloy such as, for example, nickel, iron and/or cobalt, is formed in the opening and in contact with the underlying layer 15. In embodiments, other metals can be used for the pillar 25 that show decreased wetting properties with solder such as, for example, cobalt. Although other metals are contemplated by the invention, nickel or nickel alloys will be referred to hereinafter as the material used with the invention, but this should not be considered a limiting feature. The nickel or nickel alloy pillar 25 may be about 40 microns in thickness; although other dimensions are also contemplated by the invention such as, for example, a range of about between 20 to 60 microns.

Figure 2B:
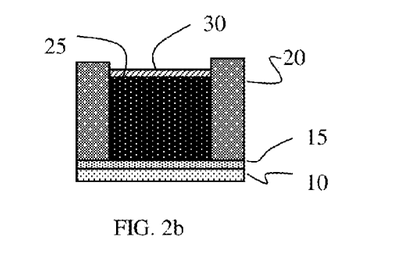

In FIG. 2b, a plate 30 is formed on the nickel or nickel alloy pillar 25. More particularly, a metal plate 30 is deposited on the nickel or nickel alloy pillar 25 using, for example, another plating bath. In embodiments, the plate 30 provides a wettable surface for the solder. The metal plate 30 can be, for example, gold (AU) or copper (CU), for example, depending on the processes used to deposit the soldering. For example, in C4NP processes, the metal plate 30 can be either gold (AU) or copper (CU); whereas, in a solder plating technique, the metal plate is copper (CU). In embodiments, the plate 30 may be subjected to a RIE process to clean the surface thereof. The copper layer can have an overall thickness in the range of about 0.2 microns to about 1 micron. The gold layer, on the other hand, can have a thickness in the range of about 0.05 microns to about 1.0 microns.

Figure 2C:
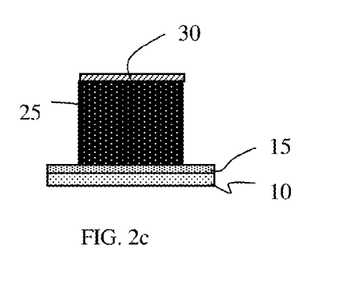

In FIG. 2c, the photoresist is stripped using conventional strippers. For example, the photoresist can be stripped using TMAH with a high pH content, with glycol to assist in swelling and NMP to aid in dissolution. Alternatively, the photoresist can be stripped using sodium or potassium hydroxide.

Figure 2D:
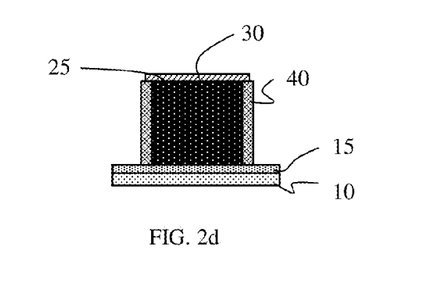

In FIG. 2d, the nickel or nickel alloy pillar 25 will be subjected to an oxygen or nitrogen environment (atmosphere) in order to modify the sidewalls (e.g., cylindrical sidewall) as shown generally at reference numeral 40. More specifically, the structure of FIG. 2c can be placed in a furnace with an oxygen environment at about 200° C. for about 15 minutes. This will form an oxidized sidewall 40, which has a thickness of about 0.05 um and a range of 0.1 to 0.005 um.

The oxidized sidewall 40 is of such thickness and tenaciousness that it will withstand post processing (i.e., remain on the sidewall of the pillar 25). For example, the oxidized sidewall 40 will withstand the removal of oxide from the surface of the plate 30 during subsequent processes. The copper oxide (on the cap portion) is easily reduced (removed) chemically by known processes such as, for example, liquid or gas flux techniques. Thus, the pillar 25 can still be joined to solder by reducing the copper oxide in an acid prior to join or using a flux during joining, but the sidewall(s) 40 will still have a thick oxide which does not wet to solder.

In an alternative process, the structure of FIG. 2d can be placed in a furnace with a nitrogen environment at about 400° C. for about 45 to 60 minutes or utilizing a glow discharge technique between 300° C. and 400° C. This will form a nitride sidewall 40, which has a thickness of about 0.04 um.

The nitride sidewall 40 is of such thickness and tenaciousness that it will withstand post processing (i.e., remain on the sidewall of the pillar 25). For example, the nitride sidewall 40 will withstand the chemical reduction (e.g., removal) of nitrogen from the surface of the plate 30 during subsequent processes, e.g., liquid or gas flux techniques. Thus, the pillar 25 can still be joined to solder by reducing the copper nitride (on the cap portion), but the sidewall(s) 40 will still have a thick nitride layer which does not wet to solder.

Figure 2E:
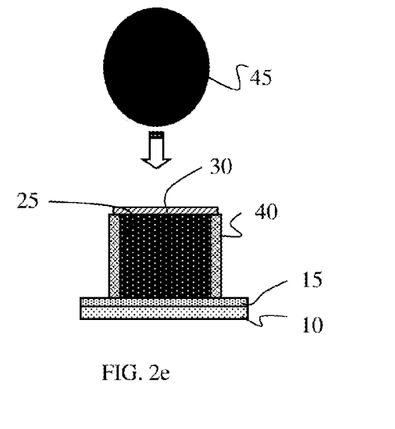
Figure 2F:
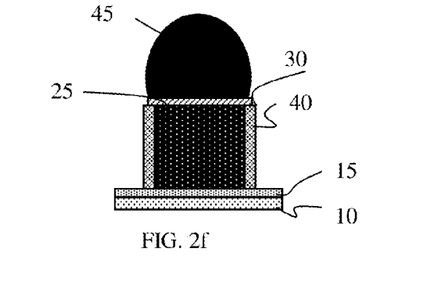

In FIG. 2e, a solder ball 45 is aligned with the nickel or nickel alloy pillar 25. This can be accomplished using known plating or C4NP processes. The solder ball 45 may be, about 2 to 30 microns. FIG. 2f shows the final structure of the invention, with the solder ball 45 wetted to the plate 30. However, as observed in FIG. 2f, the solder ball 45 does not wet the sidewall(s) of the nickel or nickel alloy pillar 25 due to the non-wettable surfaces of the pillar 25. This prevents shorting (e.g., bridging) between pillars, as well as allows reduced pitch (increased density) of the pillars, as they can now be placed closer together.

Figure 3A:
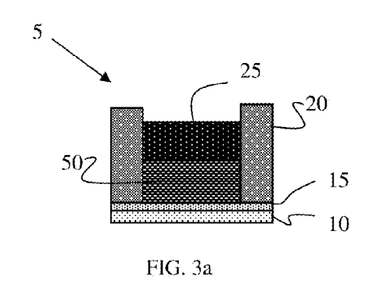
FIGS. 3a-3f show processes and respective structures in accordance with additional aspects of the invention.

FIGS. 3a-3f show processes and respective structures in accordance with alternative aspects of the invention. In particular, FIG. 3a shows a beginning structure 5. Much like the previous embodiment, the structure 5 includes a liner 10 such as, for example, any combination of Ti, Tungsten and Chrome, amongst other layers. In embodiments, the liner 10 can be, for example, about 0.165 microns thick, but can range from about 0.125 to 0.205 microns in thickness, amongst other desirable dimensions. In embodiments, the liner 10 can act as an adhesion and a barrier layer.

Still referring to FIG. 3a, a conductive layer 15 is deposited on the liner 10 using conventional processes such as, for example, a sputtering technique. In embodiments, the conductive layer 15 may be, for example, copper or other conductive materials such as, for example, nickel, nickel alloys, copper alloys, etc. The conductive layer 15 may include a seed layer. The conductive layer 15 may be about 0.45 microns thick; although other dimensions are also contemplated by the present invention such as, for example, a range of about between 0.1 to 0.6 microns.

A photoresist material 20 is deposited on the layer 15 using conventional deposition techniques such as, for example, dry film lamination or spin on resist. The photoresist material 20 is then subjected to conventional lithographic and etching processes to form an opening. Thereafter, a copper or copper alloy layer 50 is partially deposited in the opening. In embodiments, the layer 50 can have a ceramic outer layer. The layer 50 can be about 10 to 30 microns in thickness; although other dimensions are also contemplated by the invention. The limiting feature of the thickness of layer 50 is that it should be of such a height to allow a nickel or nickel alloy layer of sufficient dimension to prevent soldering wetting.

Still referring to FIG. 3a, a pillar 25 of nickel or nickel alloy such as, for example, an alloy of nickel, iron and/or cobalt, is deposited in the opening and in contact with the layer 50. The nickel or nickel alloy pillar 25 may be about 10 microns in thickness; although other dimensions are also contemplated by the invention such as, for example, a range of about between 20 to 60 microns.

Figure 3B:
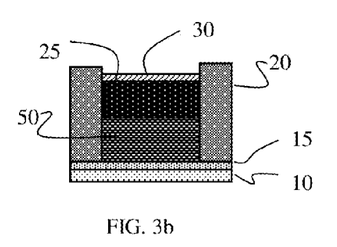

In FIG. 3b, a plate 30 is formed on the nickel or nickel alloy pillar 25. More particularly, a metal plate 30 is deposited on the nickel or nickel alloy pillar 25 using, for example, plating techniques. In embodiments, the plate 30 provides a wettable surface for the solder. As described above, the metal plate 30 can be, for example, gold (Au) or copper (Cu), depending on the processes used to deposit the soldering.

Figure 3C:
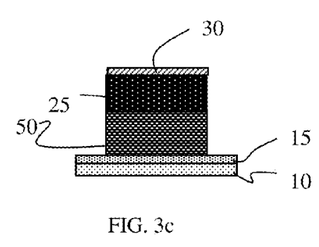

In FIG. 3c, the photoresist is stripped using conventional strippers. For example, the photoresist can be stripped using TMAH with a high pH content, with glycol to assist in swelling and NMP to assist in dissolution. Alternatively, the photoresist can be stripped using sodium or potassium hydroxide.

Figure 3D:
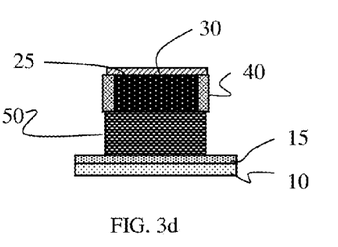

In FIG. 3d, the nickel or nickel alloy pillar 25 is subjected to an oxygen or nitrogen environment in order to modify the sidewalls (e.g., cylindrical sidewall) as shown generally at reference numeral 40 and described with reference to FIG. 2d. The oxidized sidewall 40 will withstand the removal of oxide from the surface of the plate 30 and copper 50 during subsequent processes. In the nitrogen process, the nitride sidewall 40 will withstand the chemical reduction (e.g., removal) of nitrogen from the surface of the plate 30 and copper 50 during subsequent processes. Thus, the pillar can still be joined to solder by reducing the copper oxide or copper nitride (on the cap portion and, perhaps the layer 50), but the sidewall(s) 40 will still have a thick oxide or nitride layer which does not wet to solder.

Figure 3E:
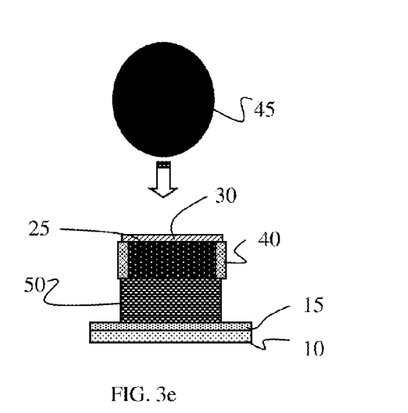

In FIG. 3e, a solder ball 45 is aligned with the nickel or nickel alloy pillar 25, using for example known plating or C4NP processes. The solder ball 45 may be, about 2 to 30 microns.

Figure 3F:
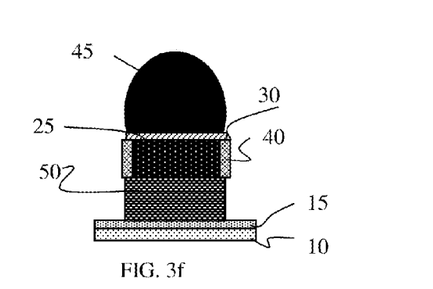

FIG. 3f shows the final structure of the invention, with the solder ball 45 wetted to the plate 30. However, as observed in FIG. 3f, the solder ball 45 does not wet the sidewall(s) of the nickel or nickel alloy pillar 25 due to the non-wettable surfaces of the pillar 25. Also, the solder ball 45 does not wet the sidewalls of the copper 50 due to the thickness (height) of the nickel or nickel alloy pillar 25. This prevents shorting (e.g., bridging) between pillars, as well as allows decreased pitch (increased density) of the pillars, as they can now be placed closer together.

Figure 4:
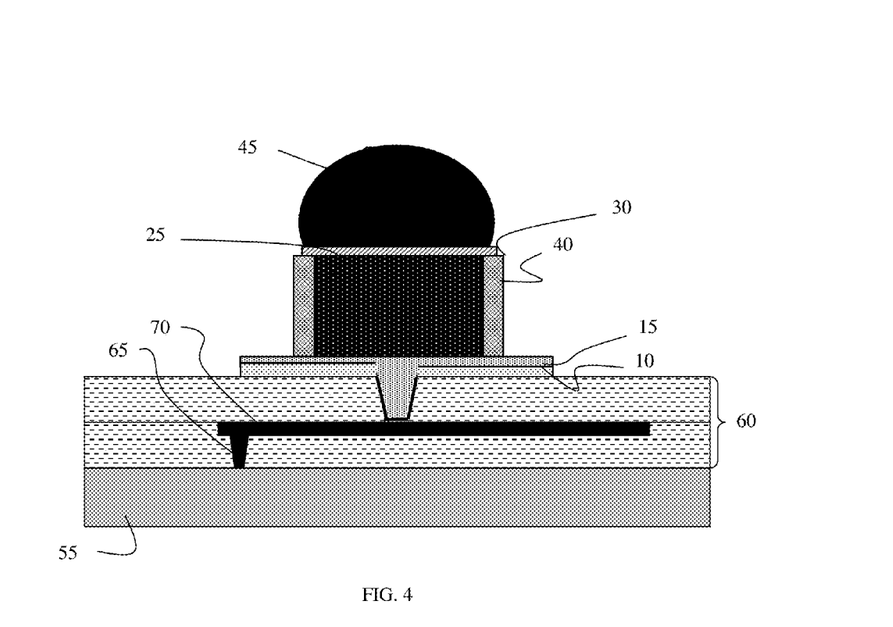
FIG. 4 shows a structure in accordance with aspects of the invention.

FIG. 4 shows a structure implementing the pillar structure and processes of the present invention. Although FIG. 4 shows a single pillar structure, it should be understood by those of skill in the art that a plurality of pillar structures can be formed on the surface of the structure using the fabrication processes above. In the example of FIG. 4, one or more dielectric layers 60 is formed on a substrate 55. The substrate 55 may be, for example, silicon or other known substrates for semiconductor devices. A metal interconnect 65 and connecting metal line 70 are formed in the one or more dielectric layers 60 using conventional damascene and deposition processes. A via is formed in an upper portion of the dielectric layers 60, in which the liner 10 is deposited thereon. In embodiments, the liner 10 is in contact with the underlying wiring metal 70. The liner 10 is also deposited on the top surface of the dielectric layers 60. The plate 15 is deposited on the liner 10, and within the via. The nickel or nickel alloy pillar 25 (with modified sidewalls 40) is formed on the plate 15. The copper (or Au) plate 30 is formed on the nickel or nickel alloy pillar 25, depending on the processes used for solder wetting, e.g., plating or C4NP processing. The solder ball 45 is flowed onto the structure.

In yet another alternative structure, the liner 10 is formed directly over the upper portion of the dielectric layers 60, and in contact with metal interconnects. In this alternative structure, the liner 10 will not be formed in a via. The copper plate 15 is deposited on the liner 10, and the nickel or nickel alloy pillar 25 (with modified sidewall(s) 40) is formed on the plate 15. The copper (or Au) plate 30 is formed on the nickel or nickel alloy pillar 25, depending on the processes used for solder wetting, e.g., plating or C4NP processing. The solder ball 45 is flowed onto the structure.

According to stress models, only about a 4.7% increase in the stress on a die is observed using a pure nickel pillar compared to a pure copper pillar. The modeling shows that structures with a nickel or nickel alloy pillar can be manufacturable for any structure that can survive a copper pillar assembly. Also, EM modeling has shown, at best, only slight differences between using Ni and Cu for pillars or pedestals. In some cases, it can be actually advantageous to have layers of Ni and Cu within the same structure so as to further decrease the differences in stress on the die between a pure nickel pillar compared to a pure copper pillar.

The use of nickel or nickel alloys will also decrease fabrication costs. The cost issue is shown in Table 1 below as the pitch becomes smaller and smaller. For example, the cost of Cu is about 15 times more expensive than the same amount of Ni. So, in one example, in a case where a 30 um pad is plated, the difference in cost between a pure Cu pillar and pure Ni pillar is about $16.00 per wafer.

TABLE 1

| VIA Size um | VIA Count | Surface Area cm² | Percent Area | 40 um C | 40 um Ni | Price Ratio |
|---|---|---|---|---|---|---|
| 90 | 1250298 | 79.54 | 11.25% | $ 7.24 | $0.48 | 15.08 |
| 129 | 425242 | 55.58 | 7.86% | $ 5.06 | $0.33 | 15.33 |
| 85 | 1154725 | 65.52 | 9.27% | $ 5.97 | $0.39 | 15.31 |
| 90 | 1662983 | 105.79 | 14.97% | $ 9.64 | $0.64 | 15.06 |
| 30 | 19488336 | 187.49 | 26.52% | $17.07 | $1.13 | 15.11 |
|  |  |  | 100 | $64.38 | $4.25 | 15.15 |

Figure 5:
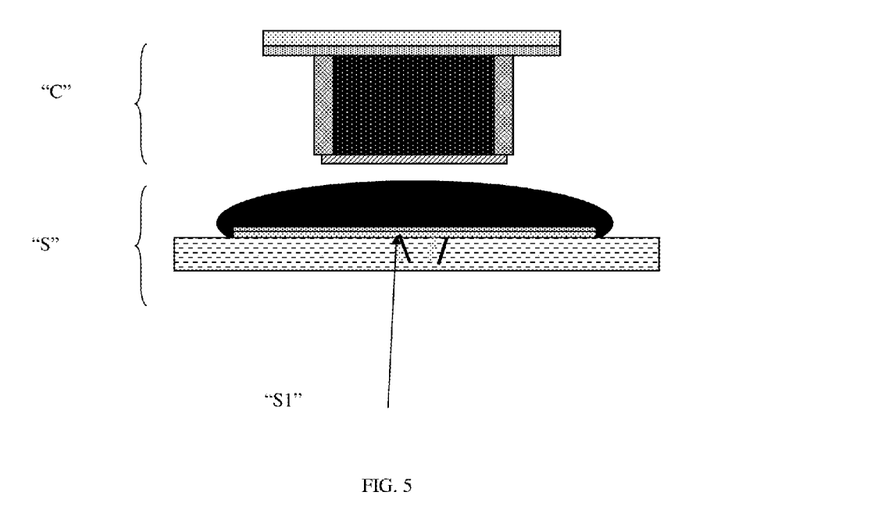
FIG. 5 shows a structure in accordance with aspects of the invention.

In embodiments of the invention, C4 (solder) is connected to the substrate. For example, solder can be applied to the substrate in almost all instances, with the exception of some ceramic carriers. It is contemplated that the solder can come from the pillar or from the substrate. In embodiments, the pillar can also be completely devoid of any solder and still be joined to the substrate. By way of example, FIG. 5 shows a chip "C" (top) and a substrate "S" (bottom). Solder "S1" is provided on the bottom for joining the chip "C" and substrate "S". As noted above, if the top were a pillar, it would not require solder, as it can use the solder on the substrate.

Figure 6:
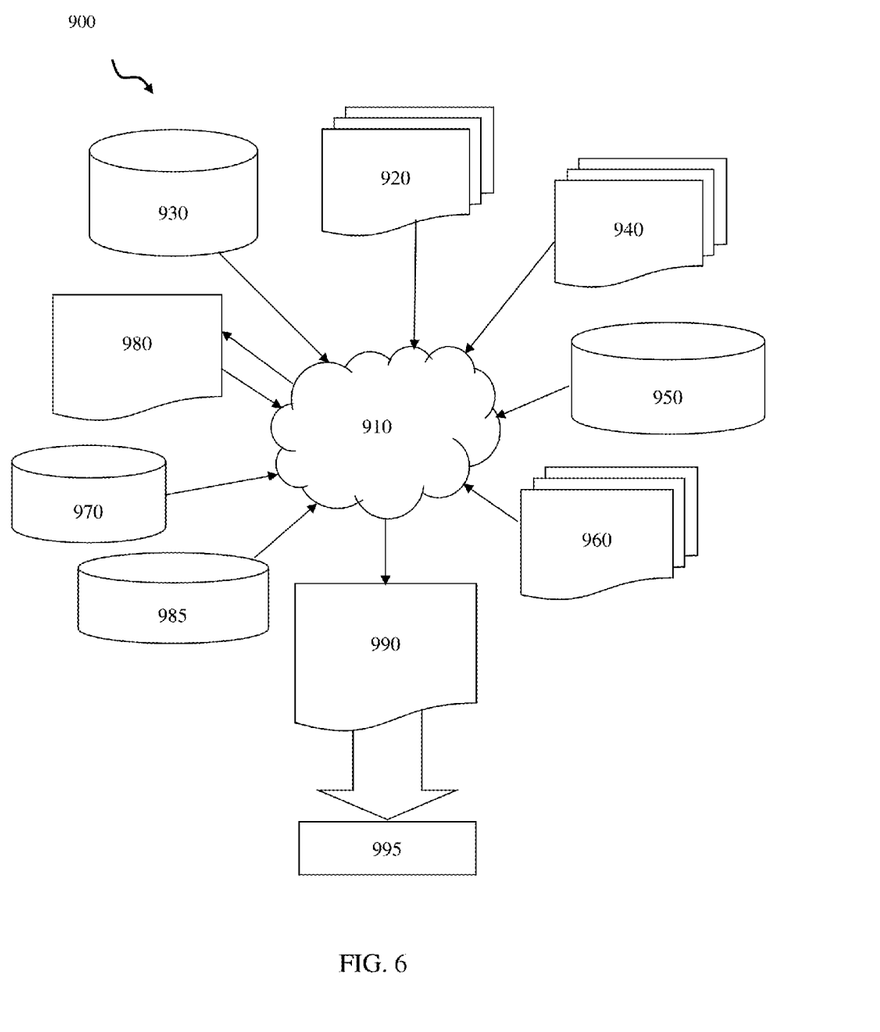
FIG. 6 is a flow diagram of a design process used in semiconductor design, manufacture, and/or test.

FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2a-5, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2*a*-5, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2*a*-5, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describe the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2*a*-5, for example. In one embodiment, design structure 990 may comprise a compiled, executable HDL simulation model that functionally simulates the devices shown in FIGS. 2*a*-5, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2a-5, for example. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed is:

1. A structure comprising:
    a copper or copper alloy platform;
    a nickel or nickel alloy pillar structure formed on a top surface of the copper or copper alloy platform, the nickel or nickel alloy pillar structure comprising at least one modified sidewall composed of oxide or nitride, which provides a non-wettable surface; and
    a cap formed on a top surface of the nickel or nickel alloy pillar structure that is a wettable surface,
    wherein a thickness of the nickel or nickel alloy pillar structure is greater than a thickness of the copper or copper alloy platform, and
    the at least one modified sidewall contacts and overhangs the top surface of the copper or copper alloy platform.

2. The structure of claim 1, wherein the cap is one of copper and gold.

3. The structure of claim 1, wherein the thickness of the nickel or nickel alloy pillar structure is of such dimension as to prevent solder wetting on the copper or copper alloy platform.

4. The structure of claim 1, further comprising a solder bump on the cap.

5. The structure of claim 1, further comprising:
    a liner; and
    a conductive layer formed between the liner and the copper or copper alloy platform and in contact with the copper or copper alloy platform.

6. The structure of claim 5, wherein the liner is Ti, Ti Tungsten, or Ti Tungsten Chrome.

7. The structure of claim 5, wherein the conductive layer is nickel, nickel alloy, copper, or copper alloy.

8. The structure of claim 1, wherein the at least one modified sidewall is an oxidized sidewall.

9. The structure of claim 1, wherein the at least one modified sidewall is a nitride sidewall.

10. The structure of claim 1, further comprising a solder bump aligned with the nickel or nickel alloy pillar structure and in contact with the cap, wherein the solder bump is not in contact with the at least one modified sidewall due to the presence of the non-wettable surface.

11. A structure comprising:
    a copper or copper alloy platform formed on a conductive layer;
    a nickel or nickel alloy pillar structure formed on a top surface of the cooper copper or copper alloy platform, the nickel or nickel alloy pillar structure comprising at least one modified sidewall composed of oxide or nitride, which provides a non-wettable surface;
    a cap formed on a top surface of the nickel or nickel alloy pillar structure that is a wettable surface,
    wherein the at least one modified sidewall is formed only on the nickel or nickel alloy pillar, and
    the at least one modified sidewall contacts and overhangs the top surface of the copper or copper alloy platform.

12. The structure of claim 11, further comprising a solder bump aligned with the nickel or nickel alloy pillar structure and in contact with the cap, wherein the solder bump is not in contact with the at least one modified sidewall due to the presence of the non-wettable surface and the solder bump is not in contact with the copper or copper alloy platform due to dimension of the nickel or nickel alloy pillar structure.

13. The structure of claim 11, wherein the copper or copper alloy platform comprises a ceramic outer layer.

* * * * *